(12) United States Patent
Alphonse

(10) Patent No.: US 6,417,524 B1
(45) Date of Patent: Jul. 9, 2002

(54) LIGHT EMITTING SEMICONDUCTOR DEVICE

(75) Inventor: Gerard A. Alphonse, Princeton, NJ (US)

(73) Assignee: Princeton Lightwave Inc., Cranbury, NJ (US)

( * ) Notice: Subject to any disclaimer, the term of this patent is extended or adjusted under 35 U.S.C. 154(b) by 0 days.

(21) Appl. No.: 09/205,575

(22) Filed: Dec. 4, 1998

Related U.S. Application Data

(63) Continuation-in-part of application No. 08/857,920, filed on May 16, 1997.
(60) Provisional application No. 60/019,362, filed on Jun. 5, 1996.

(51) Int. Cl.⁷ ............................. H01L 33/00; H01S 3/19
(52) U.S. Cl. ............................. 257/91; 257/92; 257/95; 257/99; 438/26; 438/46; 438/47; 372/46; 372/49
(58) Field of Search .................. 257/99, 91, 92; 372/49, 46; 438/26, 46, 47

(56) References Cited

U.S. PATENT DOCUMENTS

| | | | | |
|---|---|---|---|---|
| 3,573,568 A | * | 4/1971 | Siegel | 317/234 |
| 3,636,397 A | * | 1/1972 | Addamiano et al. | 313/108 |
| 4,713,821 A | | 12/1987 | Bradford et al. | 372/44 |
| 4,789,881 A | | 12/1988 | Alphonse | 357/17 |
| 4,793,679 A | | 12/1988 | Toda et al. | 350/96.15 |
| 4,821,276 A | | 4/1989 | Alphonse et al. | 372/45 |
| 4,821,277 A | | 4/1989 | Alphonse et al. | 372/45 |
| 4,856,014 A | | 8/1989 | Fiqueroa et al. | 372/46 |
| 4,958,355 A | | 9/1990 | Alphonse et al. | 372/45 |
| 4,990,971 A | * | 2/1991 | Le Creff | 357/17 |
| 5,309,001 A | * | 5/1994 | Watanabe et al. | 257/99 |
| 5,321,714 A | * | 6/1994 | Paoli | 372/50 |
| 5,818,857 A | | 10/1998 | Palmer | 372/32 |

OTHER PUBLICATIONS

Alphonse G A Et Al.: "New high–power single–mode superluminescent diode with low spectral modulation" CLEO '96. Summaries of Papers Presented at the Conference on Lasers and Electro–Optics, Anaheim, Ca, Jun. 2–7 1996, Technical Digest Series, Conference Edition (IEEE CAT. No. 96CH35899), vol. 9, 1996, pp. 107–108 (Tuesday Jun. 4) XP002125434 Washington, DC, US, Opt. Soc. America, US *the whole document*.
Patent Abstracts of Japan vol. 013, No. 507 (E–725), Mar. 10, 1989 )—& JP 63 276287 A (Fujitsu Ltd), Nov. 14, 1988 * abstract; figure 2*.
Patent Abstracts of Japan vol. 013, No. 507 (E–845), Nov. 14, 1989 —& JP 01 205479 A (NEC Corp), Aug. 17, 1989 * abstract; figures 1,3*.
Supplementary European Search Report corresponding to application No. 97928710.9–2203–US9709199.

* cited by examiner

Primary Examiner—Tom Thomas
Assistant Examiner—Donghee Kang
(74) Attorney, Agent, or Firm—Arthur L. Plevy; Duane Morris LLP

(57) ABSTRACT

Light emitting diodes each comprising a body of semiconductor material having a first side surface, a second side surface, and a top surface; and a stripe of conductive material over the top surface of the body. The stripe has a first segment and a second segment, each extending from the first side surface to the second side surface of the body. The first and second segments of the stripe are configured such that they are substantially non-parallel, and the width of the stripe at its ends is less than the width of the stripe intermediate its ends.

22 Claims, 11 Drawing Sheets

LIGHT EMITTING SEMICONDUCTOR DEVICE

RELATED APPLICATIONS

This application is a continuation-in-part application of U.S. Ser. No. 08/857,920, filed May 16, 1997, which claims the benefit of the filing date of provisional U.S. Ser. No. 60/019,362, filed Jun. 5, 1996. Both U.S. Ser. No. 08/857, 920 and provisional U.S. Ser. No. 60/019,362 are incorporated herein by reference.

STATEMENT OF GOVERNMENT RIGHTS

The United States Government has certain rights in the invention under Contract No. DAAH01-95-C-R173 awarded by DARPA.

FIELD OF THE INVENTION

The present invention relates to light emitting diodes, and more particularly, to high-power superluminescent diodes.

BACKGROUND

High-power superluminescent diodes (SLDS) are useful as low-coherent light sources for optical sensing, fiber-optic gyroscopes, and medical instrumentation, and also as gain media for mode-locked lasers and broad-band tunable lasers. An example of a conventional SLD is shown in FIG. 1. The device 10 includes a body 11 including an active layer 12, an electrode 13, and a narrow stripe 14 of a conductive material. When current is passed between the electrode 13 and the stripe 14, the active layer 12 is activated such that it generates light in the region beneath the stripe 14. The stripe 14 is placed at an angle θ with respect to the sides 15, 16 of the body 11 to minimize feedback within the stripe 14, which causes spectral modulation. Examples of conventional SLDs are provided in U.S. Pat. Nos. 4,821,277, 4,958,355, 4,821,276, 4,793,679, and 4,789,881, each of which is incorporated herein by reference.

The requirements of high-power and single-waveguide-mode operation impose conflicting constraints on the SLD stripe design. For example, output power is increased by increasing the width of the stripe 14. Such an increase in width, however, often results in the conversion to, and support of, multiple transverse modes, thus making the SLD unsuitable for many applications such as coupling to a single-mode optical fiber.

In efforts to increase SLD power while minimizing multiple transverse modes, tapered stripes have been developed as shown in FIG. 2. The tapered stripe design is described, for example, in J. N. Walpole et al., "High-Power Strained-Layer InGaAs/AlGaAs Tapered Traveling Wave Amplifier," 61 (7) *Appl. Phys. Lett.* 740–42 (1992), which is incorporated herein by reference. In the example 20 shown in FIG. 2, the stripe 24 is "tapered" such that the distance between its sides 25, 26 increases as one moves from the side 16 to the side 15 of the body 11. The taper of the stripe 24 collimates light out of the side 15 without causing significant conversion to higher order transverse modes or significant radiation from the sides of the underlying active layer. One potential problem associated with the structure shown in FIG. 2, however, is that the width of the stripe 24 at the body side 15 is relatively large such that it is difficult to couple the device 20 to a single-mode fiber. Furthermore, this wide structure often results in dark-line defects, thus reducing the useful lifetime of the device 20.

SUMMARY OF THE INVENTION

The present invention provides light emitting diodes each comprising a body of semiconductor material having a first side surface, a second side surface, and a top surface; and a stripe of conductive material over the top surface of the body. The stripe has a first segment and a second segment, each extending from the first side surface to the second side surface of the body. The width of the stripe is therefore defined by the distance between these two segments. The first and second segments of the stripe are configured such that they are substantially non-parallel, and the width of the stripe at its ends is less than the width of the stripe intermediate its ends.

One advantage of the present invention is that, when configured at an angle with respect to the end faces, it provides superluminescent diodes of high output power.

Another advantage of the present invention is that it provides superluminescent diodes characterized by broad output spectra without significant spectral modulation.

Another advantage of the present invention is that it provides superluminescent diodes that minimize higher order transverse modes.

Another advantage of the present invention is that it provides a high power optical amplifier.

Another advantage of the present invention is that it can be configured as a high power laser by providing external feedback.

Yet another advantage of the present invention is that it provides superluminescent diodes of high output power that are amenable to coupling to single-mode fibers.

DETAILED DESCRIPTION

Figure 1:
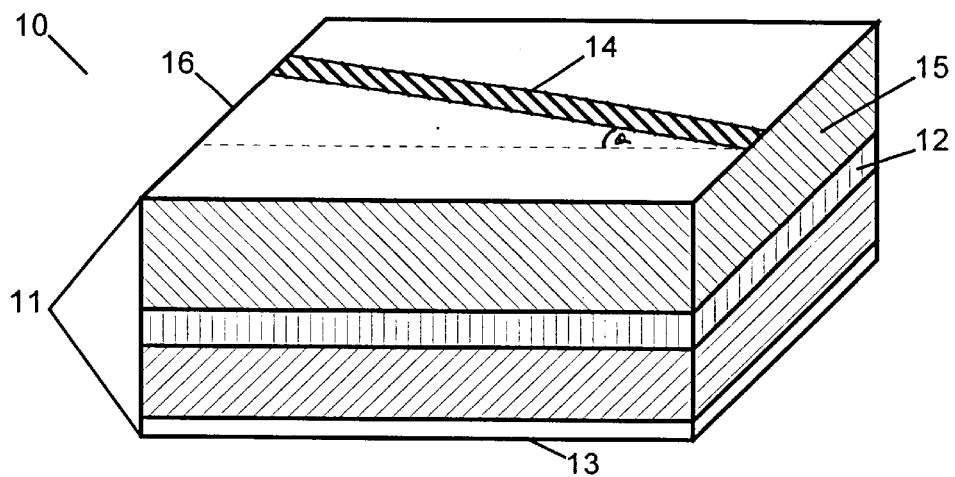
FIG. 1 shows an isometric view of a prior art SLD device.
Figure 2:
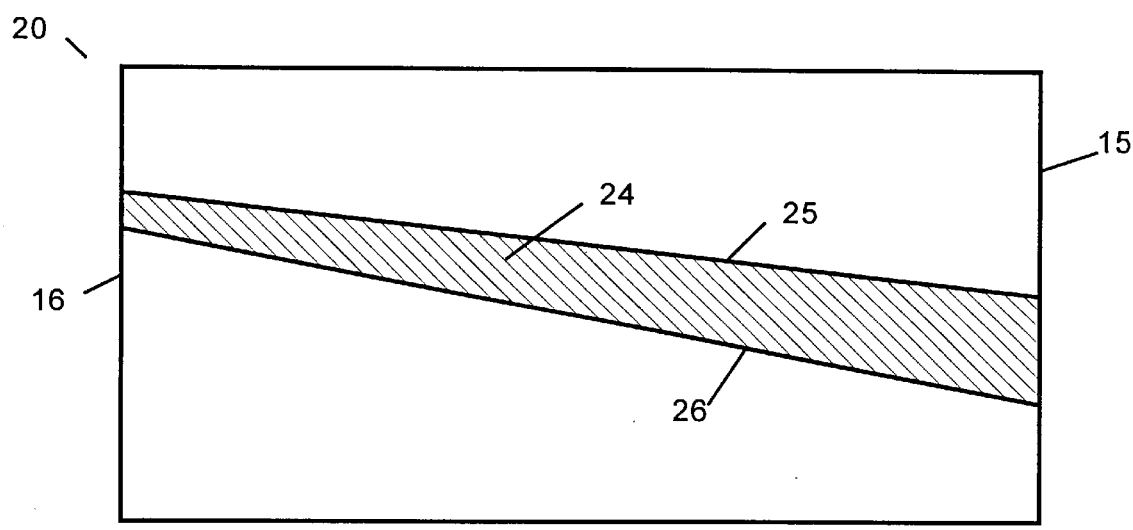
FIG. 2 shows a top plan view of a prior art SLD device including a tapered stripe.
Figure 3:
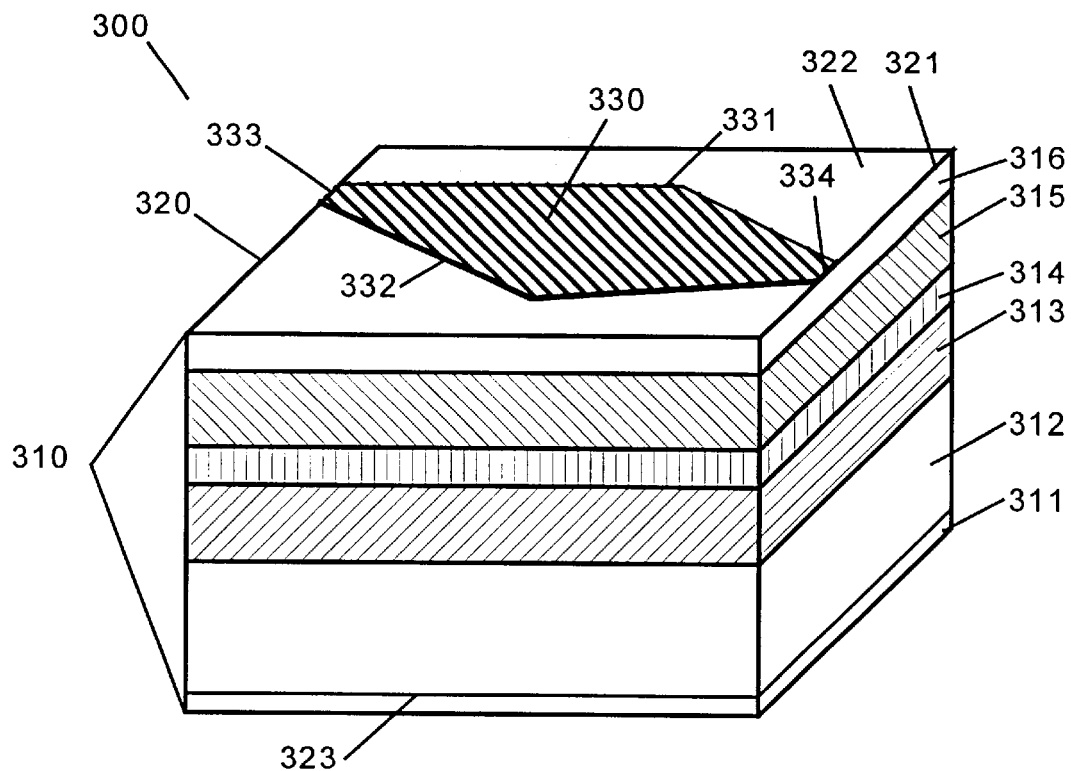
FIG. 3 shows an isometric view of a SLD device, in accordance with an embodiment of the present invention.

An embodiment of the invention is shown in FIG. 3. The light emitting diode 300 comprises a body 310 having a first side surface 320, a second side surface 321, a top surface 322, and a bottom surface 323; and a stripe 330 of conductive material over the top surface 322 of the body 310. The stripe 330 has a first segment 331 and a second segment 332, each of which extends from the first side surface 320 to the second side surface 321. The width of the stripe 330 is therefore defined by the distance between these two segments 331, 332. The first and second segments 331, 332 of the stripe 330 are configured such that they are substantially non-parallel to each other, and the width of the stripe at its ends 333, 334 (i.e., at the first and second side surfaces 320, 321, respectively) is less than the width of the stripe intermediate the stripe ends 333, 334.

The body 310 comprises any known structure for forming a light emitting diode. For example, the body 310 includes a first electrode 311 preferably comprising a conductive material such as gold, silver, germanium, aluminum, or alloys thereof; a substrate 312 preferably comprising a conductive semiconductor material of a first conductivity type, such as N-type gallium arsenide; a first clad layer 313 preferably comprising a semiconductor material of the first conductivity type, such as N-type gallium aluminum arsenide; an active layer 314 preferably comprising an undoped semiconductor material having a band gap lower than that of the first clad layer 313; a second clad layer 315 preferably comprising the same material as the first clad layer 313 but of opposite conductivity type, such as P-type gallium aluminum arsenide; and a contact 316 of conductive semiconductor material of the same conductivity type as the second clad layer 315, such as P-type gallium arsenide. The stripe 330 comprises any suitable conductive material, such as gold, silver, aluminum, titanium, platinum, chromium, or alloys thereof.

Although the body 310 of the device 300 is described with specific reference to substrate, cladding and active layers and materials, the present invention includes any electroluminescent structures and materials that result in the production of light in response to the passage of electric current therethrough.

Figure 4:
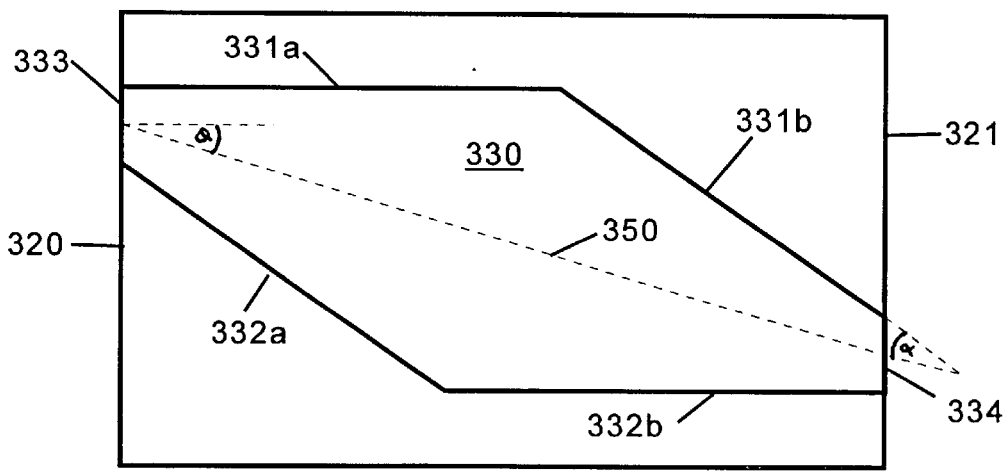
FIG. 4 shows a top plan view of the SLD device shown in FIG. 3.
Figure 5:
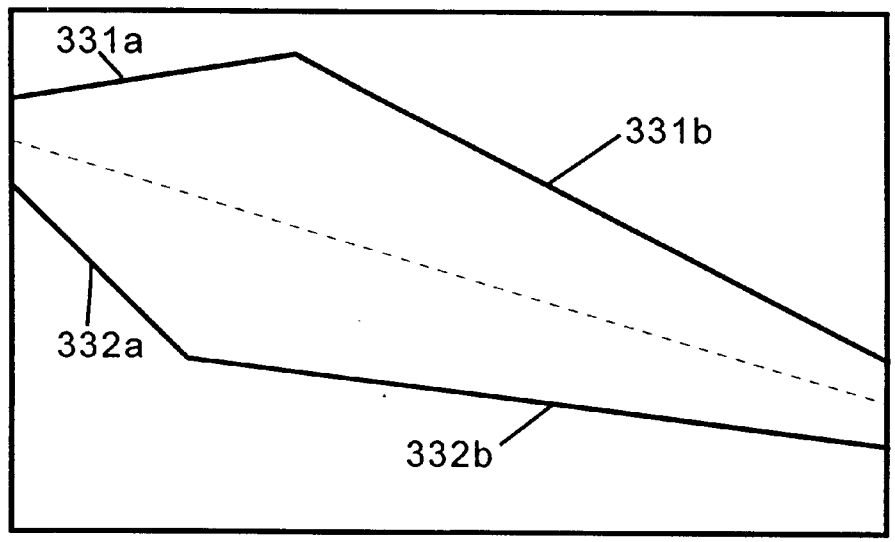
FIGS. 5 to 12 show top plan views of examples of stripe configurations, in accordance with various embodiments of the present invention.
Figure 6:
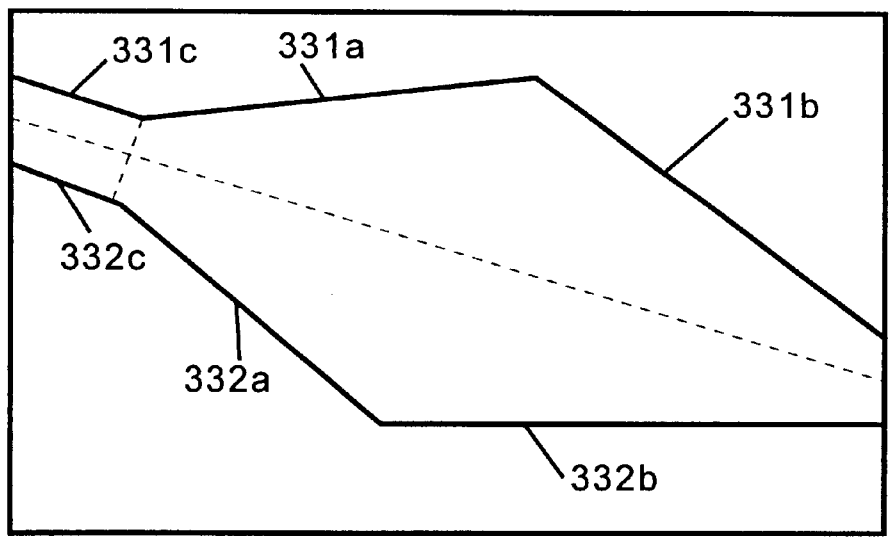
Figure 7:
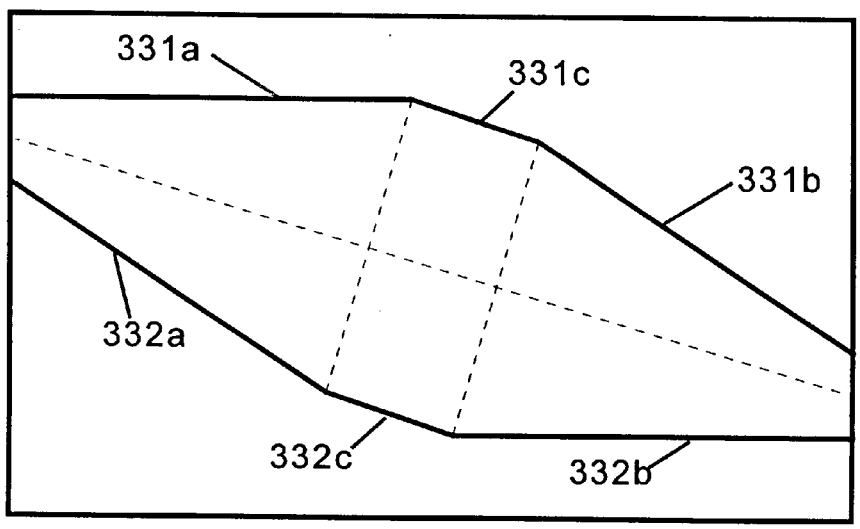
Figure 8:
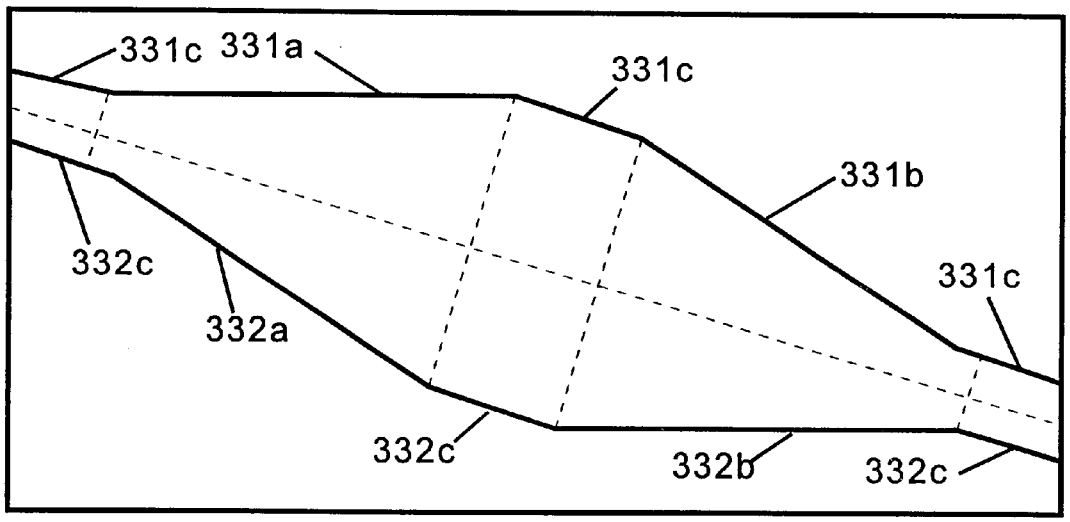
Figure 9:
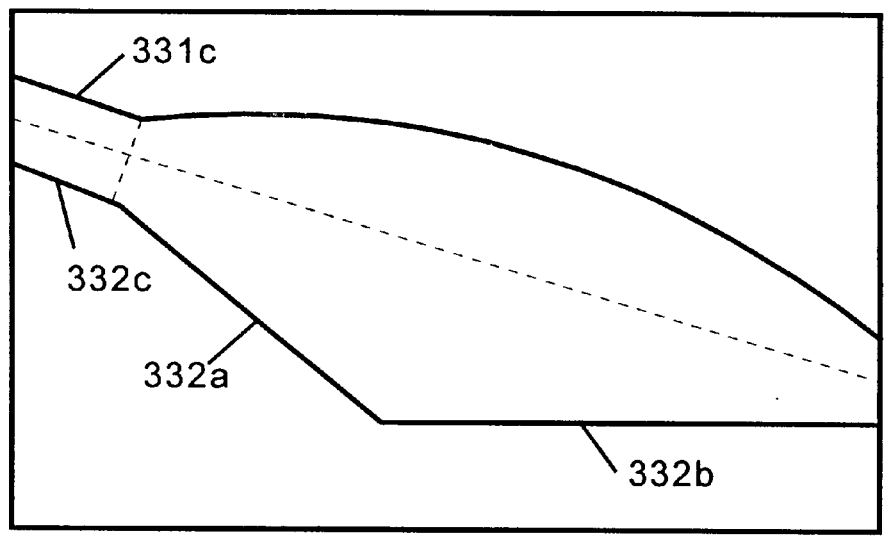
Figure 10:
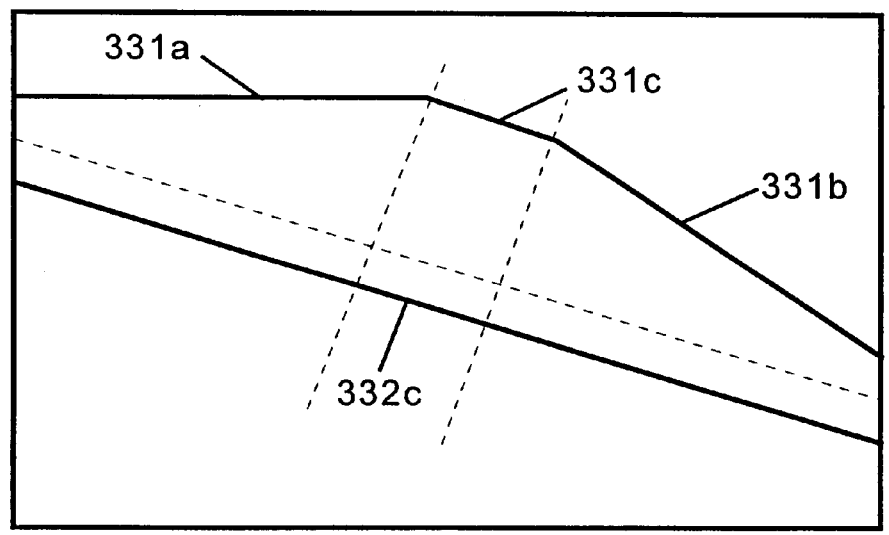
Figure 11:
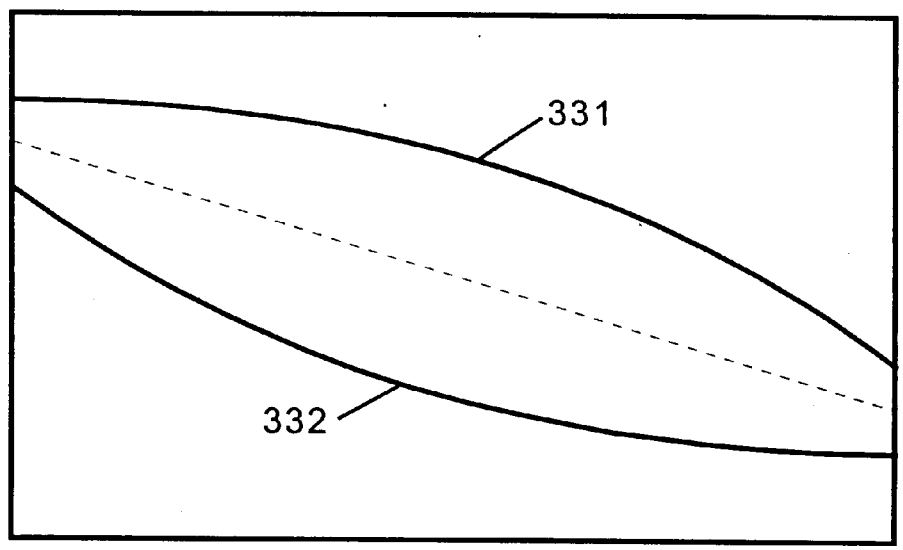
Figure 12:
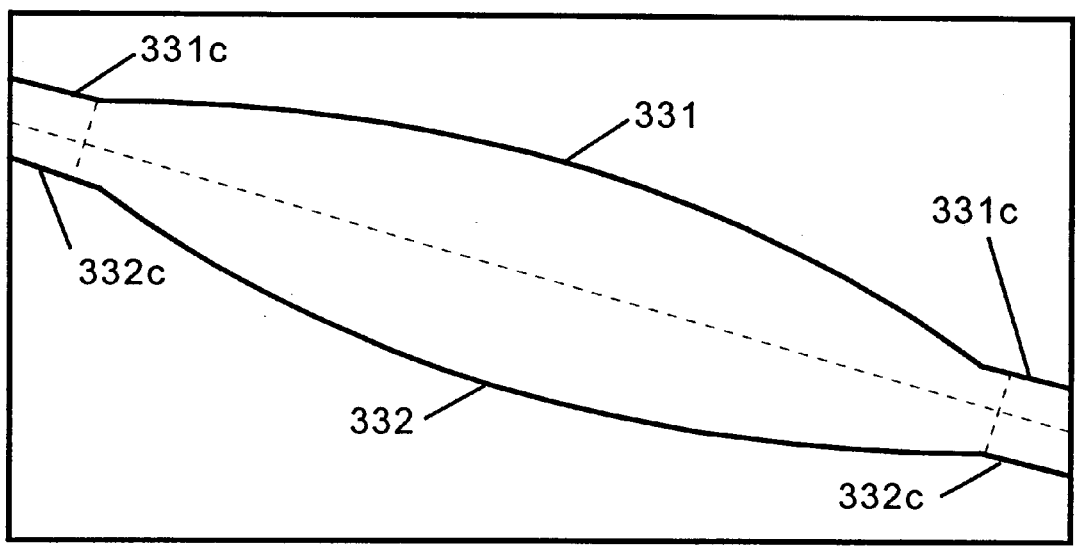

As shown in FIG. 4, which is a top view of the SLD device shown in FIG. 3, the boundaries of the stripe 330 are defined by the first segment 331, the second segment 332, and the first and second body sides 320, 321, which intersect the stripe 330 to form respective stripe ends 333, 334. The width of the stripe 330 is defined by the distance between the first and second segments 331, 332. In this embodiment, each of the first and second segments 331, 332 comprise a first segment side 331a, 332a and a second segment side 331b, 332b. As in all embodiments of the present invention, the width of the first and second stripe ends 333, 334 are each less than the width of the stripe 330 intermediate the first and second stripe ends 333, 334. For convenient reference, the shape of the stripe shown in FIGS. 3 and 4 is referred to as a diamond.

The advantages of the invention are at least partly owed to the configuration of the stripe, which serves as an electrode. By applying a voltage across the stripe 330 and the first electrode 311, an electric current is passed through the active layer 314. The active layer 314, which comprises an electroluminescent material, thereby generates light in a region that corresponds in shape to that of the stripe 314. In accordance with the present invention, the stripe is configured such that the power of the device 300 is maximized, the formation of high-order transverse modes is minimized, and the device 300 remains amenable to coupling with other devices such as single mode fibers.

The stripe 330 is any of a number of possible configurations provided that (i) the first and second segments 331, 332 are substantially non-parallel; and (ii) the width of the first and second stripe ends 333, 334 are each less than the width of the stripe 330 intermediate the ends 333, 334. Various examples of stripe configurations in accordance with embodiments of the invention are shown in FIGS. 4 to 12.

The first and second segments 331, 332 are said to be "substantially non-parallel" such the length of any opposing parallel portions of the segments 331, 332 is not sufficiently long to support transverse (i.e., lateral) resonance within the active layer 314. For example, it is preferred that any opposing parallel portions 331c, 332c, as shown in the embodiments illustrated in FIGS. 6 to 10 and 12, are less than about 50 microns in length, more preferably less than about 10 microns in length. By keeping any such opposing parallel portions to a minimum length, the percentage of lateral modes supported within the active layer 314 is minimized.

In some embodiments, the first and second segments 331, 332 each include a first segment side 331a, 332a and a second segment side 331b, 332b, as shown in FIGS. 4 to 8. When used, the segment sides are of any suitable shape such as, for example, linear, parabolic, exponential, or the like. In other embodiments, such as those shown in FIGS. 9 and 10, only one of the first and second segments include segment sides. In still other embodiments, such as those shown in FIGS. 11 and 12, neither of the first and second segments 331, 332 include segment sides.

Regardless of whether the first and segments include segment sides, it is preferred that the first and second segments 331, 332 are tapered with respect to each other such that the width of the stripe 330 adiabatically expands from the first stripe end 333 to some maximum width, and then adiabatically contracts from the maximum width to the second stripe end 334. As used herein, "adiabatic" is used to describe the taper of the first and/or second segments 331, 332 such that less than about 10% of light generated in the active layer 314 is either lost to radiation or converted to higher order modes within the active layer 314. As an example, it is preferred that the angle, $\alpha$, between a first or second segment, and a longitudinal centerline 350 of the stripe 330 is up to about 3°. The longitudinal centerline 350 extends from the midwidth of the first stripe end 333 to the midwidth of the second stripe end 334. It is preferred but not necessary that the first and second segments 331, 332 are substantially symmetric about the longitudinal centerline such as the configuration shown in FIG. 4.

In all embodiments of the invention, it is preferred that the stripe 330 be at an angle, $\theta$, relative to the direction perpendicular to at least one of the first and second side surfaces 320, 321 of the body 310. By placing the stripe 330 at such an angle, feedback from the first and second side surfaces 320, 321 into the active layer 314, which results in spectral modulation, is reduced. Preferably, the angle $\theta$ is typically about 6° to 8°. Optimization of the angle $\theta$ for reduced feedback is achieved by known techniques. For example, U.S. Pat. Nos. 4,821,277, 4,958,355, 4,821,276, and 4,793,679, each incorporated herein by reference, are illustrative. To further assist in minimizing feedback within the active layer 314, the first and/or second sides 320, 321 are optionally coated with an antireflection coating comprising, for example, a layer having an optical thickness (i.e., actual thickness divided by the refractive index) of about one-quarter the center emission wavelength of the device, and having a refractive index of about equal to the square root of the index of the active layer for output into air or free space. Materials meeting this requirement include, for example, scandium oxide, aluminum oxide, and silicon nitride.

The invention is further described with reference to the following non-limiting examples.

EXAMPLE 1

A superluminescent diode was formed into the structure shown in FIG. 3 using known deposition techniques. The diode included a 1-mm-long diamond-shaped stripe 330 at an angle of 6° with respect to the plane perpendicular to the body sides 320, 321, linearly tapered from a width of about 10 microns at the body sides 320, 321 to a width of about 57 microns at the center of the stripe. The body 310 was fabricated using an InGaAs-AlGaAs graded-index separate-confinement heterostructure with compressively strained double-quantum-well (GRIN-SCH-MQW) layers. The body 310 consisted of the following layers: a graded-doping $Al_{0.60}Ga_{0.40}As$ n-clad layer of about 1.2 micron thickness; an undoped linearly compositional-graded $Al_{0.60-0.35}Ga_{0.40-0.65}As$ confining layer of about 0.12 micron thickness; an undoped InGaAs quantum well of about 6.0 nanometers thickness; an undoped $Al_{0.35}Ga_{0.65}As$ barrier of about 30 nanometers thickness; an undoped InGaAs quantum well of about 6.0 nanometers thickness; an undoped linearly compositional-graded $Al_{0.35-0.60}Ga_{0.65-0.40}As$ confining layer of about 0.12 micron thickness; a graded-doping $Al_{0.60}Ga_{0.40}As$ p-clad layer of about 1.0 micron thickness; and a GaAs p-contact layer of about 0.30 micron thickness. The quantum wells were under 0.57% compressive strain with composition of $In_{0.08}Ga_{0.92}As$. The structure was grown by low-pressure metal organic chemical vapor deposition (MOCVD) in an Emcore reactor. The source materials were trimethylaluminum, thrmethylgallium, trimethylindium, and arsine, and the n- and p-type dopants were hydrogen selenide and carbon tetrachloride, respectively. The device was coated with an antireflection coating to enhance transmission.

Figure 13:
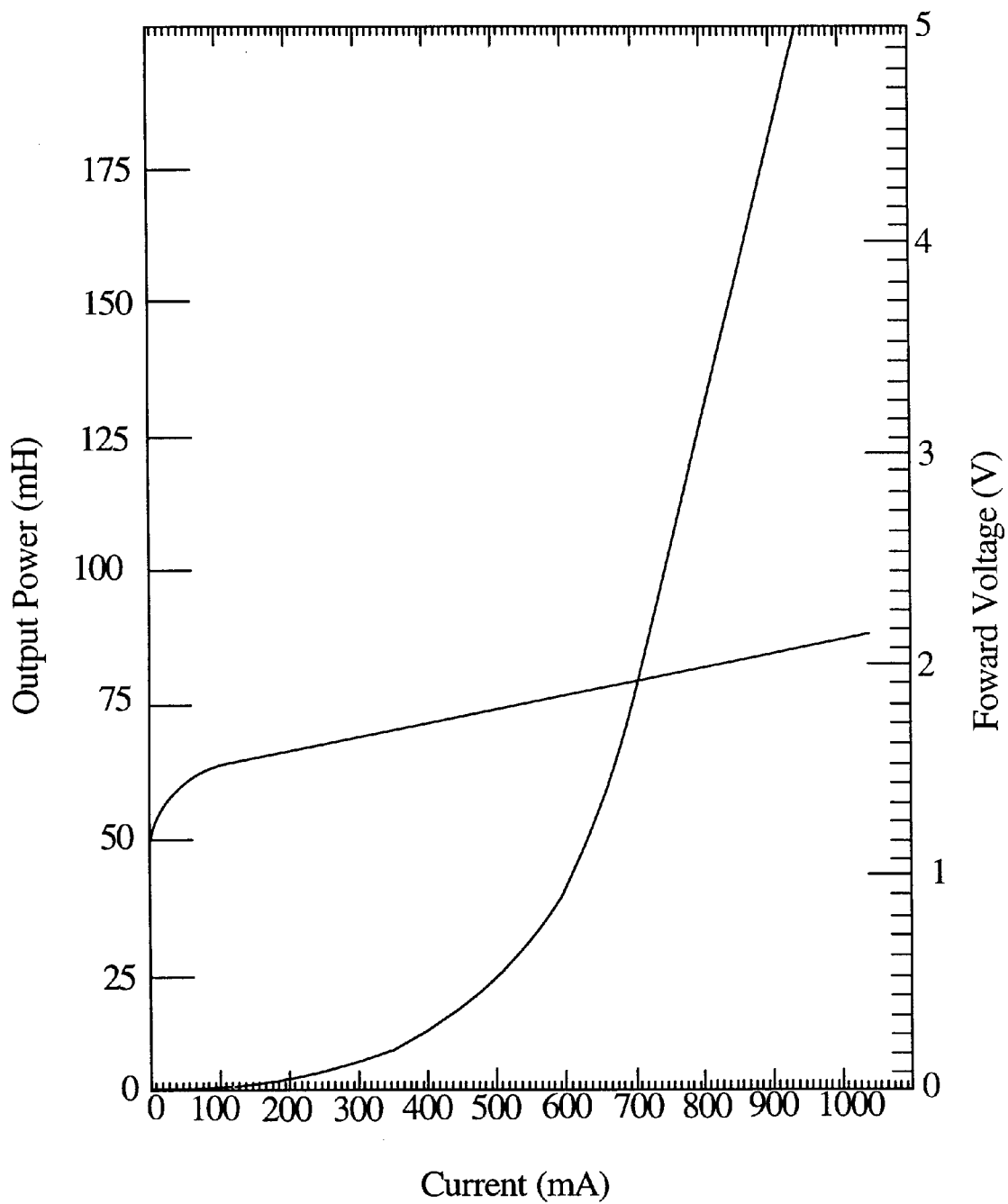
FIG. 13 shows the voltage versus current and output power versus current characteristics for a light emitting diode in accordance with an embodiment of the present invention.
Figure 14:
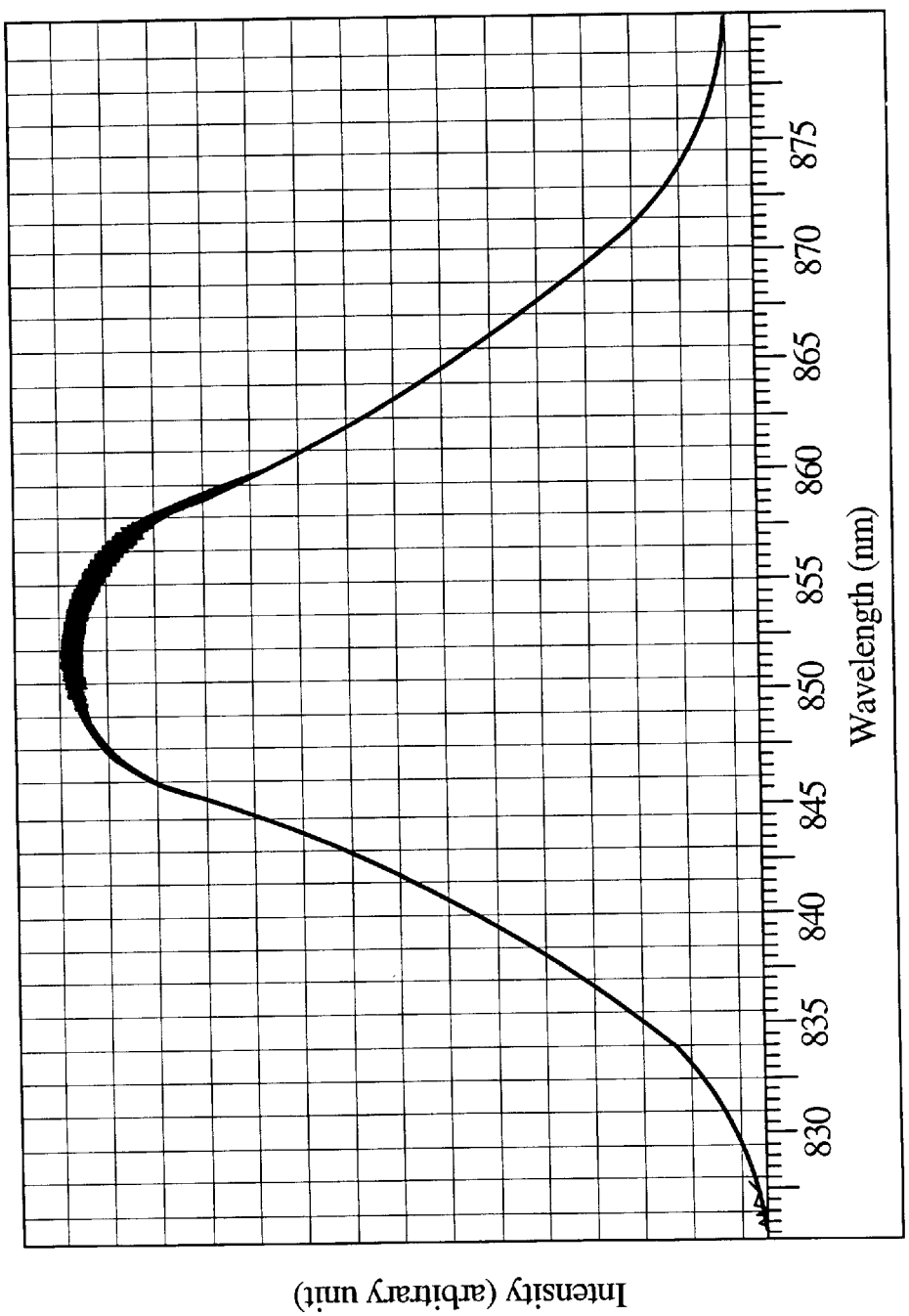
FIG. 14 shows the output spectrum of a light emitting diode in accordance with an embodiment of the present invention.
Figure 15:
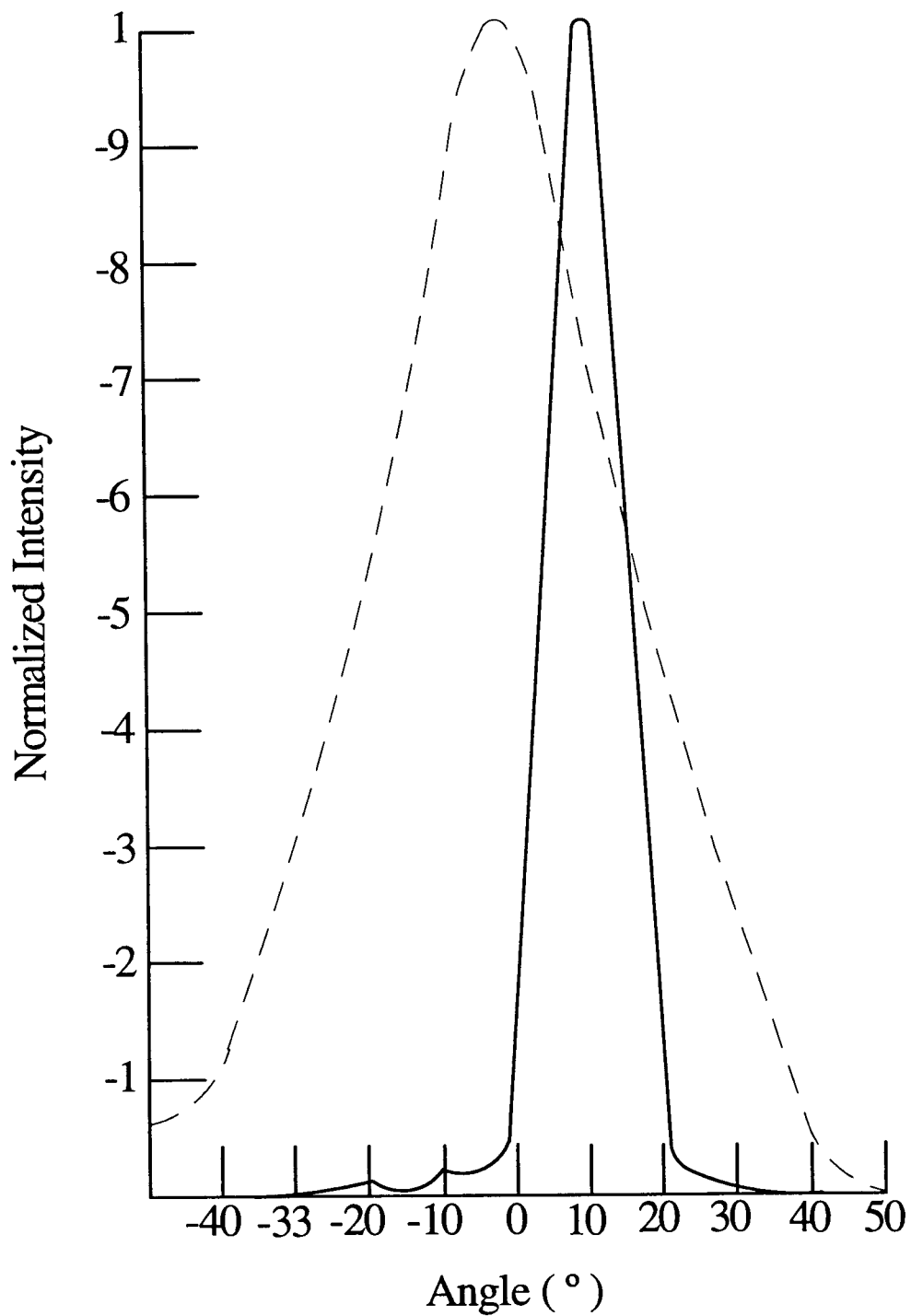
FIG. 15 shows the perpendicular and parallel far-field pattern of a light emitting diode in accordance with an embodiment of the present invention.

FIG. 13 shows the voltage versus current and output power versus current characteristics to 175 mW for the device on a submount with a thermoelectric cooler and heatsink, showing no sign of saturation or overheating as can be seen by bending of the P-I curve. The measured differential quantum efficiency was 23% at 175 mW. The output spectrum at 175 mW is shown in FIG. 14. The spectral modulation was less than 2% near the peak at a wavelength of about 848 nanometers, and the half-power bandwidth was about 23 nanometers. FIG. 15 shows the perpendicular and parallel far-field pattern indicating a full-width-half-maximum range of 8°×35° without high-order lateral modes. The output angle was about 21° (the data shows 11° because of a 10° offset in experimental setup). These results represent a new SLD performance record.

EXAMPLE 2

A superluminescent diode was formed into the structure shown in FIG. 3 using the materials and deposition techniques described in Example 1. In this example, the diode included a 2-mm-long diamond-shaped stripe 330 at an angle of 6° with respect to the plane perpendicular to the body sides 320, 321, linearly tapered from stripe end widths of 30 microns to a width of about 75 microns at the center of the stripe.

Figure 16:
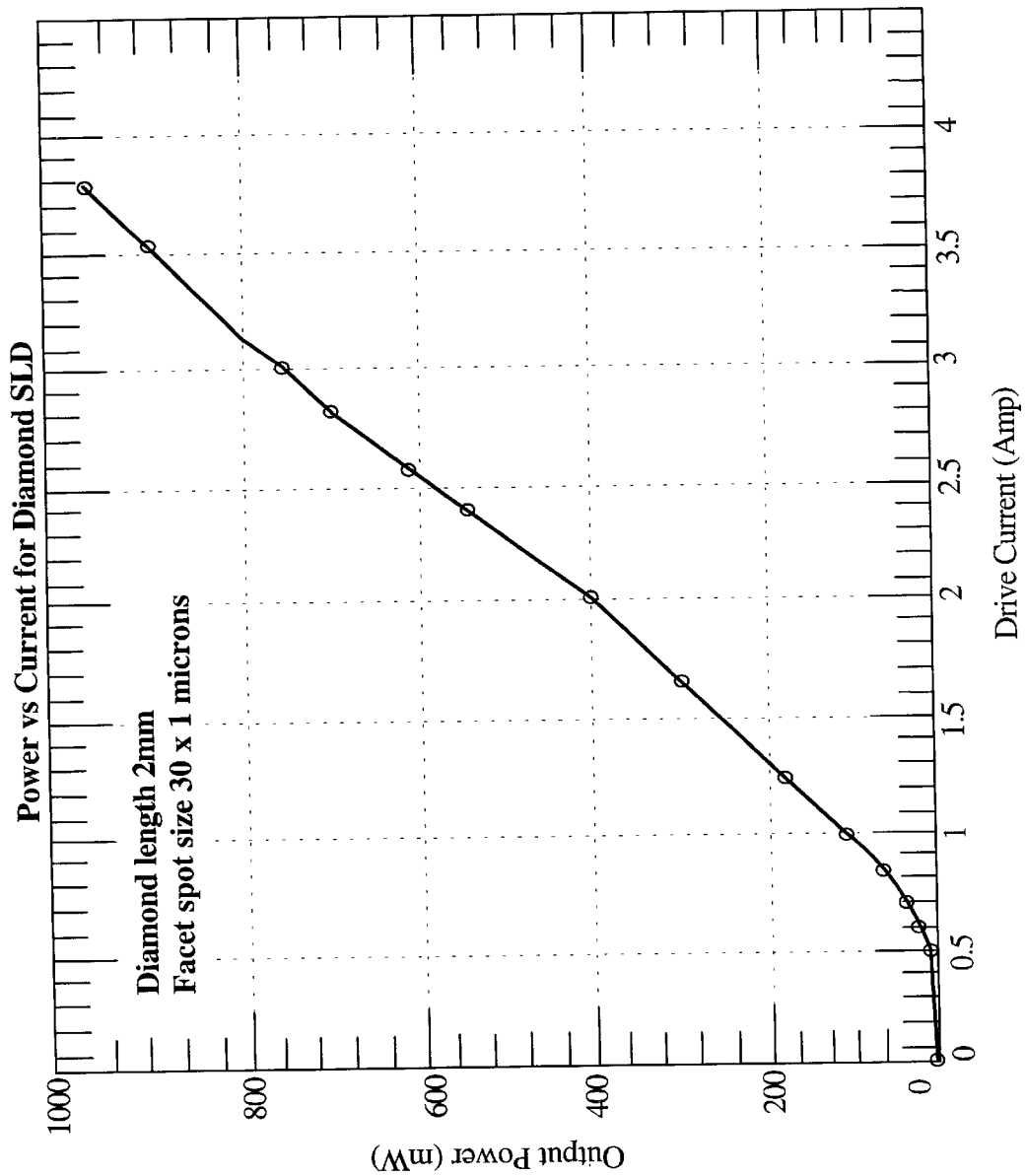
FIG. 16 shows the output power versus current characteristics for a light emitting diode in accordance with an embodiment of the present invention.
Figure 17:
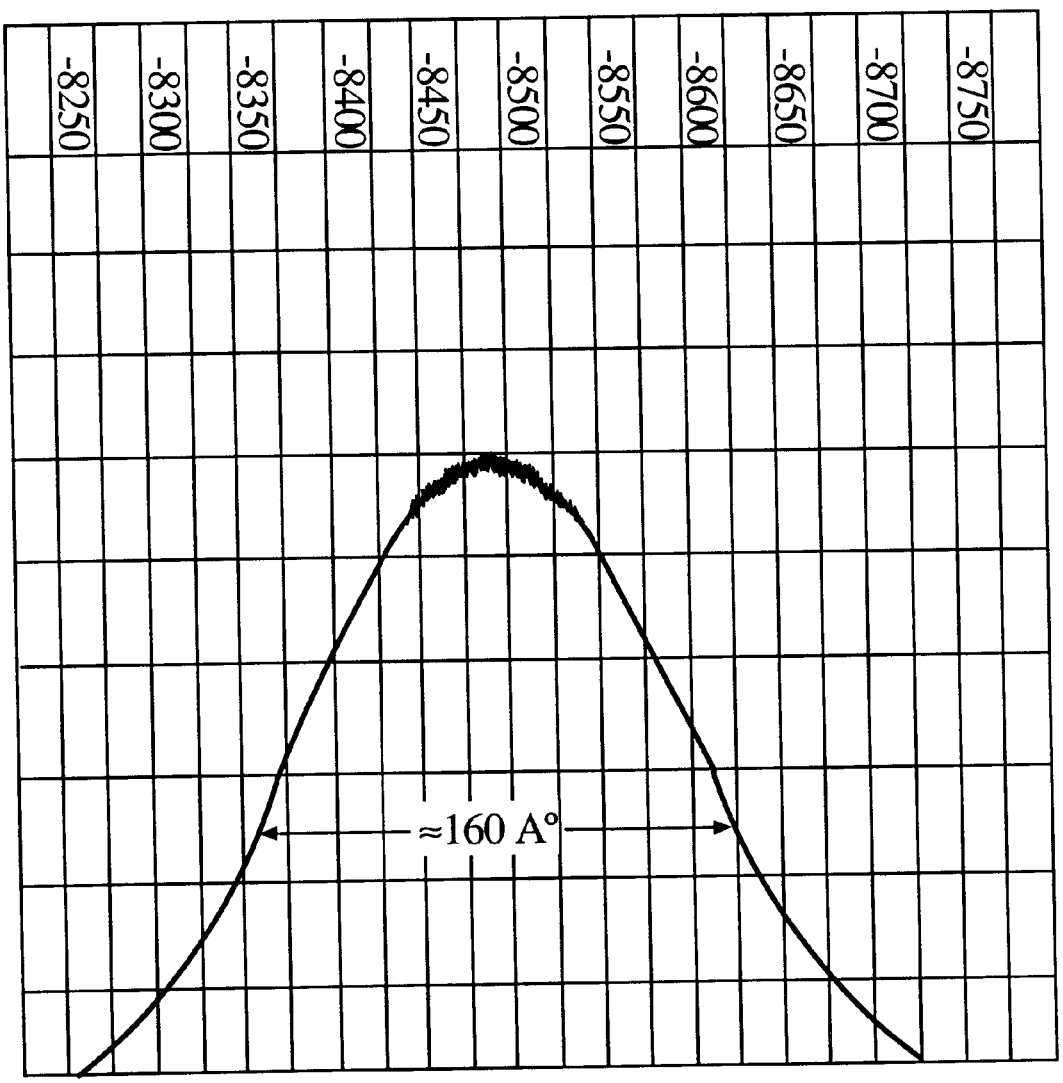
FIG. 17 shows the output spectrum of a light emitting diode in accordance with an embodiment of the present invention.

FIG. 16 shows the output power versus current characteristics to an output power of about 1000 mW. The output spectrum at about 50 mW is shown in FIG. 17. The spectral modulation was less than 2% near the peak at a wavelength of about 844 nanometers, and the half-power bandwidth was about 16 nanometers.

The present invention provides for high output power superluminescent diodes with minimal spectral modulation and higher-order transverse modes. Those with skill in the art may recognize various modifications to the embodiments of the invention described and illustrated herein. Such modifications are meant to be covered by the spirit and scope of the appended claims.

What is claimed is:

1. A light emitting diode comprising:
   a body having a first side surface, a second side surface, and a top surface, said body comprising an active layer for generating light; and
   a stripe of conductive material over said top surface of said body, said stripe having a first segment and a second segment; wherein
      the width of said stripe is defined by the distance between said first and second segments;
      said first and second segments each extend from the first side surface to the second side surface of said body;
      said first and second segments of said stripe are substantially non-parallel;
      said first and second segments of said stripe are separated by a distance at the first and second side surfaces of said body to form respective first and second stripe ends; and
      the width of said first and second stripe ends are each less than the width of said stripe intermediate said first and second stripe ends.

2. The light emitting diode of claim 1, wherein at least one of said first and second segments comprises a first segment side and a second segment side, the first segment side extending at an adiabatic taper from the first side surface of said body and the second segment side extending at an adiabatic taper from the second side surface of said body.

3. The light emitting diode of claim 2, wherein said adiabatic taper deviates from a longitudinal axis of said stripe by up to about 3°, said longitudinal axis extending from the midwidth of said first stripe end to the midwidth of said second stripe end.

4. The light emitting diode of claim 2, wherein said taper is selected so that less than about 10% of the light generated by said active layer is lost to radiation within said active layer.

5. The light emitting diode of claim 2, wherein said taper is selected so that less than about 10% of the light generated by said active layer is converted to higher order modes within said active layer.

6. The light emitting diode of claim 1, wherein each of said first and second segments comprise a first segment side and a second segment side, the first segment sides extending at an adiabatic taper from the first side surface of said body and the second segment sides extending at an adiabatic taper from the second side surface of said body.

7. The light emitting diode of claim 2, wherein at least one of said first and second side segments has a linear shape.

8. The light emitting diode of claim 2, wherein at least one of said first and second side segments has a parabolic shape.

9. The light emitting diode of claim 2, wherein at least one of said first and second side segments has an exponential shape.

10. The light emitting diode of claim 1, wherein the plane perpendicular to at least one of said first and second stripe ends is non-parallel to a longitudinal axis of said stripe, said longitudinal axis extending from the midwidth of said first stripe end to the midwidth of said second stripe end.

11. The light emitting diode of claim 10, wherein said plane perpendicular to at least one of said first and second stripe ends deviates from said longitudinal axis at an angle of about 6° to about 8°.

12. The light emitting diode of claim 1, wherein the planes perpendicular to each of said first and second stripe ends are non-parallel to a longitudinal axis of said stripe, said longitudinal axis extending from the midwidth of said first stripe end to the midwidth of said second stripe end.

13. The light emitting diode of claim 1, wherein any opposing parallel portion of said first and second segments has a length of about 50 microns or less.

14. The light emitting diode of claim 1, wherein any opposing parallel portion of said first and second segments has a length of about 10 microns or less.

15. The light emitting diode of claim 1, wherein said stripe comprises a conductive material selected from the group consisting of gold, silver, aluminum, and alloys thereof.

16. The light emitting diode of claim 1, wherein the width of at least one of said first and second stripe ends is less than about 20 microns.

17. The light emitting diode of claim 16, wherein the width of said stripe at a location intermediate said first and second stripe ends is greater than about 50 microns.

18. The light emitting diode of claim 1, wherein the width of at least one of said first and second stripe ends is less than about 10 microns.

19. The light emitting diode of claim 18, wherein the width of said stripe at a location intermediate said first and second stripe ends is greater than about 50 microns.

20. The light emitting diode of claim 1, wherein said body includes an electrode such that said active layer is positioned between said electrode and said stripe, said active layer comprising an electroluminescent material such that said active layer generates light when a voltage is applied across said electrode and said stripe.

21. In a light emitting device, a stripe of conductive material having a first segment and a second segment, wherein the width of said stripe is defined by the distance between said first and second segments;

said first and second segments each extend from a first side surface to a second side surface of said light emitting device;

said first and second segments of said stripe are substantially non-parallel;

said first and second segments of said stripe are separated by a distance at the first and second side surfaces of said light emitting device to form respective first and second stripe ends; and the width of said first and second stripe ends are each less than the width of said stripe intermediate said first and second stripe ends.

22. A method of using a light emitting device, said light emitting device comprising a body having a first side surface, a second side surface, and a top surface, said body comprising an active layer for generating light; a stripe of conductive material over said top surface of said body; and an electrode such that said active layer is positioned between said electrode and said stripe; said stripe having a first segment and a second segment; wherein the width of said stripe is defined by the distance between said first and second segments; said first and second segments each extend from the first side surface to the second side surface of said body; said first and second segments of said stripe are substantially non-parallel; said first and second segments of said stripe are separated by a distance at the first and second side surfaces of said body to form respective first and second stripe ends; and the width of said first and second stripe ends are each less than the width of said stripe intermediate said first and second stripe ends; the method comprising the step of:

applying a voltage across said electrode and said stripe such that said active layer generates light.

* * * * *